United States Patent
Iliopoulos (10) Patent No.: US 10,937,637 B2
(45) Date of Patent: Mar. 2, 2021

(54) DETERMINING SUSCEPTOR SERVICE LIFE IN A PLASMA PROCESSING CHAMBER

(71) Applicant: Applied Materials, Inc., Santa Clara, CA (US)

(72) Inventor: Ilias Iliopoulos, Foster City, CA (US)

(73) Assignee: Applied Materials, Inc., Santa Clara, CA (US)

( * ) Notice: Subject to any disclaimer, the term of this patent is extended or adjusted under 35 U.S.C. 154(b) by 571 days.

(21) Appl. No.: 15/692,996

(22) Filed: Aug. 31, 2017

(65) Prior Publication Data

US 2019/0066986 A1    Feb. 28, 2019

(51) Int. Cl.
| | | |
|---|---|---|
| H01J 37/32 | (2006.01) | |
| G05B 23/02 | (2006.01) | |
| H01L 21/687 | (2006.01) | |
| H01J 37/244 | (2006.01) | |
| H01L 21/67 | (2006.01) | |
| G01N 21/88 | (2006.01) | |

(52) U.S. Cl.
CPC .... *H01J 37/32926* (2013.01); *G05B 23/0283* (2013.01); *H01J 37/244* (2013.01); *H01J 37/3288* (2013.01); *H01J 37/3299* (2013.01); *H01J 37/32715* (2013.01); *H01J 37/32935* (2013.01); *H01L 21/67115* (2013.01); *H01L 21/68785* (2013.01); *G01N 21/8806* (2013.01); *H01J 37/32724* (2013.01); *H01J 37/32733* (2013.01); *H01J 2237/20214* (2013.01); *H01J 2237/20235* (2013.01); *H01L 21/67069* (2013.01)

(58) Field of Classification Search
CPC ............. H01J 37/32926; H01J 37/244; G05B 23/0283
See application file for complete search history.

(56) References Cited

U.S. PATENT DOCUMENTS

| | | |
|---|---|---|
| 6,895,293 B2 | 5/2005 | Reiss et al. |
| 6,915,173 B2 | 7/2005 | Chan et al. |
| 8,473,089 B2 | 6/2013 | Albarede et al. |
| 2002/0055801 A1* | 5/2002 | Reiss ............... G05B 19/41865 700/111 |
| 2005/0011611 A1* | 1/2005 | Mahoney .......... H01J 37/32935 156/345.24 |

(Continued)

FOREIGN PATENT DOCUMENTS

| | | |
|---|---|---|
| JP | 2005175215 A | 6/2005 |
| WO | 2006010128 A2 | 1/2006 |

OTHER PUBLICATIONS

Gupta et al, Rationale Behind the Virtual Sensors and Their Applications, 2016,m IEEE Xplore., Intl. Conference on Advances in Computing, Communications and Informatics (ICACCI), Sep. 21-24, 2016, Jaipur, India, pp. 1608-1614 (Year: 2016).*

(Continued)

*Primary Examiner* — Lisa E Peters
(74) *Attorney, Agent, or Firm* — Patterson + Sheridan, LLP (57) ABSTRACT

In one embodiment of the invention, a method for predicting a susceptor's service life in a processing chamber is disclosed. The method begins by creating virtual sensors in a processing chamber having a susceptor. The virtual sensors monitor one or more parameters on the susceptor and the age of the susceptor is tracked throughout the susceptor's life in the processing chamber with the virtual sensors.

21 Claims, 3 Drawing Sheets

(56) References Cited

U.S. PATENT DOCUMENTS

| | | | |
|---|---|---|---|
| 2009/0246406 A1 | 10/2009 | Nakayama et al. | |
| 2015/0039552 A1* | 2/2015 | Moyne | G06Q 40/00 706/52 |
| 2016/0092618 A1 | 3/2016 | Kommisetti et al. | |
| 2016/0216185 A1 | 7/2016 | Gottscho | |

OTHER PUBLICATIONS

International Search Report and Written Opinion from PCT/US2018/046679 dated Dec. 4, 2018.

* cited by examiner

DETERMINING SUSCEPTOR SERVICE LIFE IN A PLASMA PROCESSING CHAMBER

FIELD

A method for predicting service life events for semiconductor processing chamber is disclosed herein. More specifically, embodiments disclosed herein relate to determining service life of a susceptor disposed in plasma processing chamber.

BACKGROUND

The classical breakdown of economic sectors fall into the retrieval and production of raw materials, such as food and iron; the transformation of the raw materials into intermediate materials or goods, such as computers, vehicles and clothing; and supplying services to consumers such as legal or bank. At least the first two sectors rely on machines to produce or fabricate the goods which enter the marketplace. Time and materials are a major consideration in the added costs of goods entering the market place. These added costs come from materials wasted due to defects and time spent in both fabricating and maintaining the equipment for fabrication.

Reducing wasted material and time spent on producing goods directly affect the cost of manufacturing and benefit the industry and consumer alike. The time spent on producing goods may include scheduled downtime for maintaining the equipment or unscheduled downtime in response to unexpected or unforeseen failures in the manufacturing equipment or process or a component of either. Unscheduled downtime is a major source of lost revenue in all of manufacturing. Conventionally, manufacturers have scheduled maintenance to reduce material defects associated with worn equipment and unscheduled downtime due to equipment failure. The latter can result in lost and more variable productivity, lower and more variable product quality, higher replacement part inventory costs, higher repair human resourcing costs, product scrap, and costly damage to equipment and equipment components.

During some semiconductor manufacturing operations, substrates may be disposed on a susceptor inside a plasma processing chamber. The plasma processing chamber has a high temperature and corrosive environment which attacks the chamber components such as the susceptor. After multiple chamber operations, the chamber components may become worn and introduce contamination to the chamber environments or skew the process in a manner which results in substrate defects. One of the main reasons for preventative maintenance (PM) is when the susceptor has reached the end of its service life. As semiconductor manufacturers push the PMs further apart there is a higher risk for unscheduled downtime.

Therefore, there is a need for an improved method for determining when maintenance of process equipment should occur.

SUMMARY

In one embodiment of the invention, a method for determining susceptor's service life in a processing chamber is disclosed. The method begins by creating virtual sensors in a processing chamber having a susceptor. The virtual sensors monitors one or more parameters on the susceptor and the age of the susceptor is tracked throughout the susceptor's life in the processing chamber with the virtual sensors.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

The descriptions of the various embodiments of the present disclosure are presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Embodiments of the present invention generally relate to methods for estimating the service life of chamber components. In one embodiment, the method estimates the service life of a susceptor. In the method, tool data is collected through data mining software during the production recipe. One or more virtual sensors are created based on the process parameters in the chamber. A "service life index" is determined using information from the virtual sensors and then used to estimate the remaining life of the susceptor in the chamber.

Figure 1:
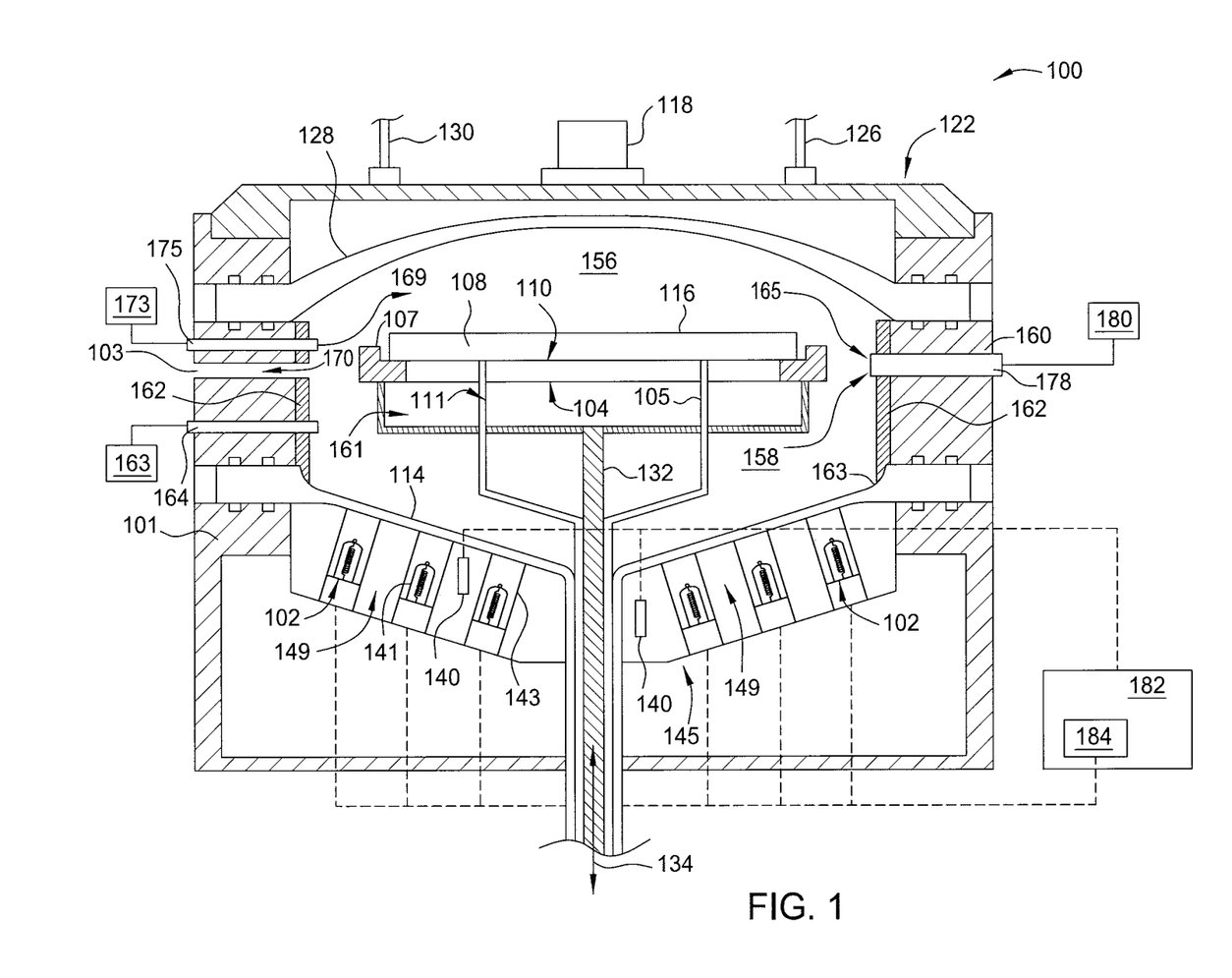
FIG. 1 is a schematic sectional view of a processing chamber according to one embodiment of the invention.

FIG. 1 is a schematic sectional view of a processing chamber 100 according to one embodiment of the invention. The processing chamber 100 may be used to process one or more substrates, including deposition of a material on an upper surface of a substrate, such as an upper surface 116 of a substrate 108 depicted in FIG. 1. The processing chamber 100 includes a chamber body 101 connected to, an upper dome 128 and a lower dome 114. In one embodiment, the upper dome 128 may be fabricated from a material such as a stainless steel, aluminum, or ceramics including quartz, including bubble quartz (e.g., quartz with fluid inclusions), alumina, yttria, or sapphire. The upper dome 128 may also be formed from coated metals or ceramics. The lower dome 114 may be formed from an optically transparent or translucent material such as quartz. The lower dome 114 is coupled to, or is an integral part of, the chamber body 101. The chamber body 101 may include a base plate 160 that supports the upper dome 128.

A reflector 122 may be optionally placed outside the upper dome 128 to reflect infrared light that is radiating from the substrate 108 or transmitted by the substrate 108 back onto the substrate 108. Due to the reflected infrared light, the efficiency of the heating will be improved by containing heat that could otherwise escape the processing chamber 100. The reflector 122 can be made of a metal such as aluminum or stainless steel. The reflector 122 can have the inlet portal 126 and exit portal 130 to carry a flow of a fluid such as water for cooling the reflector 122. If desired, the reflection efficiency can be improved by coating a reflector area with a highly reflective coating, such as a gold coating.

A liner assembly 162 may be disposed within the chamber body 101 and is surrounded by the inner circumference of the base plate 160. The liner assembly 162 may be formed from a process-resistant material and generally shields the processing volume (i.e., a process gas region 156 and a purge gas region 158) from metallic walls of the chamber body 101. An opening 170, such as a slit valve, may be disposed through the liner assembly 162 and aligned with the loading port 103 to allow for passage of the substrate 108.

Process gas supplied from a process gas supply source 173 is introduced into the process gas region 156 through a process gas inlet port 175 formed in the sidewall of the base plate 160. Additional openings (not shown) may also be formed in the liner assembly 162 to allow gas to flow therethrough. The process gas inlet port 175 is configured to direct the process gas in a generally radially inward direction. During the film formation process, the susceptor 107 is located in the processing position, which is adjacent to and at about the same elevation as the process gas inlet port 175, thereby allowing the process gas to flow along flow path 169 defined across the upper surface 116 of the substrate 108. The process gas exits the process gas region 156 (along flow path 165) through a gas outlet port 178 located on the opposite side of the processing chamber 100 relative to the process gas inlet port 175. Removal of the process gas through the gas outlet port 178 may be facilitated by a vacuum pump 180 coupled thereto. As the process gas inlet port 175 and the gas outlet port 178 are aligned to each other and disposed approximately at the same elevation, it is believed that such a parallel arrangement will enable a generally planar, uniform gas flow across the substrate 108. Further radial uniformity may be provided by the rotation of the substrate 108 through the susceptor 107.

Purge gas supplied from a purge gas source 163 is introduced to the purge gas region 158 through a purge gas inlet port 164 formed in the sidewall of the base plate 160. The purge gas inlet port 164 is disposed at an elevation below the process gas inlet port 175. The purge gas inlet port 164 is configured to direct the purge gas in a generally radially inward direction. If desired, the purge gas inlet port 164 may be configured to direct the purge gas in an upward direction. During the film formation process, the susceptor 107 is located at a position such that the purge gas flows along flow path 161 across a back side 104 of the susceptor 107. Without being bound by any particular theory, the flowing of the purge gas is believed to prevent or substantially avoid the flow of the process gas from entering into the purge gas region 158, or to reduce diffusion of the process gas entering the purge gas region 158 (i.e., the region under the susceptor 107). The purge gas exits the purge gas region 158 (along flow path 166) and is exhausted out of the process chamber through the gas outlet port 178 located on the opposite side of the processing chamber 100 relative to the purge gas inlet port 164.

An array of radiant heating lamps 102 is disposed below the lower dome 114 for heating, among other components, a backside 104 of a susceptor 107 disposed within the processing chamber 100. During deposition, the substrate 108 may be brought into the processing chamber 100 and positioned onto the susceptor 107 through a loading port 103. The lamps 102 are adapted to heat the substrate 108 to a predetermined temperature to facilitate thermal decomposition of process gases supplied into the processing chamber to deposit a material onto the upper surface 116 of the substrate 108. In one example, the material deposited onto the substrate 108 may be a group III, group IV, and/or group V material, or a material which includes a group III, group IV, and/or group V dopant. For example, the deposited material may be one or more of gallium arsenide, gallium nitride, or aluminum gallium nitride. The lamps 102 may be adapted to heat the substrate 108 to a temperature of between about 300 degrees Celsius to about 1200 degrees Celsius, such as about 300 degrees Celsius to about 950 degrees Celsius.

The lamps 102 may include bulbs 141 surrounded by an optional reflector 143 disposed adjacent to and beneath the lower dome 114 to heat the substrate 108 as the process gas passes thereover to facilitate the deposition of the material onto the upper surface 116 of the substrate 108. The lamps 102 are arranged in annular groups of increasing radius around a shaft 132 of the susceptor 107. The shaft 132 is formed from quartz and contains a hollow portion or cavity therein, which reduces lateral displacement of radiant energy near the center of the substrate 108, thus facilitating uniform irradiation of the substrate 108.

In one embodiment, each lamp 102 is coupled to a power distribution board (not shown) through which power is supplied to each lamp 102. The lamps 102 are positioned within a lamp head 145 which may be cooled during or after processing by, for example, a cooling fluid introduced into channels 149 located between the lamps 102. The lamp head 145 conductively cools the lower dome 114 due in part to the close proximity of the lamp head 145 to the lower dome 114. The lamp head 145 may also cool the lamp walls and walls of the reflectors 143. If desired, the lamp heads 145 may be in contact with the lower dome 114.

The susceptor 107 is shown in an elevated processing position, but may be moved vertically by an actuator (not shown) to a loading position below the processing position to allow lift pins 105 to contact the lower dome 114. The lift pins 105 pass through holes 111 in the susceptor 107 and raise the substrate 108 from the susceptor 107. A robot (not shown) may then enter the processing chamber 100 to engage and remove the substrate 108 therefrom through the loading port 103. A new substrate is placed on the susceptor 107, which then may be raised to the processing position to place the substrate 108, with upper surface 116 wherein devices mostly formed thereon facing up, in contact with a front side 110 of the susceptor 107.

The susceptor 107 disposed in the processing chamber 100 divides the internal volume of the processing chamber 100 into the process gas region 156 (above the front side 110 of the susceptor 107) and the purge gas region 158 (below the susceptor 107). The susceptor 107 is rotated during processing by the shaft 132 to minimize the effects of thermal and process gas flow spatial non-uniformities within the processing chamber 100, and thus facilitate uniform processing of the substrate 108. The susceptor 107 is supported by the shaft 132, which moves the substrate 108 in an up and down direction 134 during loading and unloading, and in some instances, during processing of the substrate 108. The susceptor 107 may be formed from a material having low thermal mass or low heat capacity, so that energy absorbed and emitted by the susceptor 107 is minimized. The susceptor 107 may be formed from silicon carbide or graphite coated with silicon carbide to absorb radiant energy from the lamps 102 and rapidly conduct the radiant energy to the substrate 108. In one embodiment, the susceptor 107 is shown in FIG. 1 as a ring having a central opening to facilitate exposure of the center of the substrate to the thermal radiation generated by the lamps 102. The susceptor 107 may support the substrate 108 from the edge of the substrate 108. In another embodiment, the susceptor 107 may also be a disk member that has no central opening. In yet another embodiment, the susceptor 107 may also be a disk-like or platter-like substrate support, or a plurality of pins extending from a respective finger, for example, three pins or five pins.

An optical pyrometer 118 may be disposed at a region above the upper dome 128. The optical pyrometer 118 measures a temperature of the front side 110 of the susceptor 107 and when the substrate 108 is disposed in the processing chamber 100, the upper surface 116 of the substrate 108. Heating the substrate 108 from the front side 110 of the susceptor 107 in this manner provides for more uniform heating due to the absence of die patterns. As a result of being on the side opposite that of the source ration and being effectively shielded from the source radiation, the optical pyrometer 118 only senses radiation from the hot susceptor 107 or substrate 108, with minimal background radiation from the lamps 102 directly reaching the optical pyrometer 118. In certain embodiments, multiple pyrometers may be used and may be disposed at various locations above the upper dome 128.

A plurality of thermal radiation sensors 140, which may be pyrometers or light pipes, such as sapphire light pipes, may be disposed in the lamp head 145 for measuring thermal emissions of the substrate 108. The sensors 140 are typically disposed at different locations in the lamp head 145 to facilitate viewing (i.e., sensing) different locations of the substrate 108 during processing. In embodiments using light pipes, the sensors 140 may be disposed on a portion of the chamber body 101 below the lamp head 145. Sensing thermal radiation from different locations of the substrate 108 facilitates comparing the thermal energy content, for example the temperature, at different locations of the substrate 108 to determine whether temperature anomalies or non-uniformities are present. Such temperature non-uniformities can result in non-uniformities in film formation, such as thickness and composition. At least two sensors 140 are used, but more than two may be used. Different embodiments may use any number of additional sensors 140. It is noted that these sensors 140 being on the same sides of the substrate 108 as the radiant heating sources may require a correction technique to compensate for the back scattered source radiation.

Each sensor 140 views a zone of the substrate 108 and senses the thermal state of that zone. The zone may be oriented radially in some embodiments. For example, in embodiments where the substrate 108 is rotated, the sensors 140 may view, or define, a central zone in a central portion of the substrate 108 having a center substantially the same as the center of the substrate 108, with one or more zones surrounding the central zone and concentric therewith. It is not required that the zones be concentric and radially oriented. In some embodiments, zones may be arranged at different locations of the substrate 108 in non-radial fashion.

The sensors 140 are typically disposed between the lamps 102, for example in the channels 149, and are usually oriented substantially normal to the upper surface 116 of the substrate 108. In some embodiments the sensors 140 are oriented normal to the substrate 108, while in other embodiments, the sensors 140 may be oriented in slight departure from normal. An orientation angle within about 5° of normal is most frequently used.

The sensors 140 may be attuned to the same wavelength or spectrum, or to different wavelengths or spectra. For example, substrates used in the processing chamber 100 may be compositionally homogeneous, or they may have domains of different compositions. Using sensors 140 attuned to different wavelengths may allow monitoring of substrate domains having different composition and different emission responses to thermal energy. In one embodiment, the sensors 140 are attuned to infrared wavelengths, for example about 3 µm.

During processing, a controller 182 receives data from the sensors 140 and separately adjusts the power delivered to each lamp 102, or individual groups of lamps or lamp zones, based on the data. The controller 182 may include a power supply 184 that independently powers the various lamps 102 or lamp zones. The controller 182 can be configured to produce a desired temperature profile on the substrate 108, and based on comparing the data received from the sensors 140, the controller 182 may adjust the power to lamps and/or lamp zones to conform the observed (i.e., sensed) thermal data indicating of the lateral temperature profile of the substrate with to the desired temperature profile. The controller 182 may also adjust power to the lamps and/or lamp zones to conform the thermal treatment of one substrate to the thermal treatment of another substrate, to prevent chamber performance drift over time.

The controller 182 may be configured to run process recipes, i.e., programs, to instruct control chamber operations. For example, the controller 182 may provide instructions for the purge gas to enter the processing chamber 100 and the lamps 102 to heat the purge gas. Sensors 140 may detect the temperature of the susceptor 107 and provide the temperature information back to the controller 182 for adjusting the lamps 102.

As will be appreciated by one of ordinary skill in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may be referred to herein as a "circuit," "module" or "system." Furthermore, aspects of the present invention may take the form of a computer program product embodied in one or more computer readable medium(s) having computer readable program code embodied thereon. The controller 182 may computer or other suitable device for controlling the processing chamber 100. Aspects of the invention may run on the controller 182 or external device attached to the controller 182.

Figure 2:
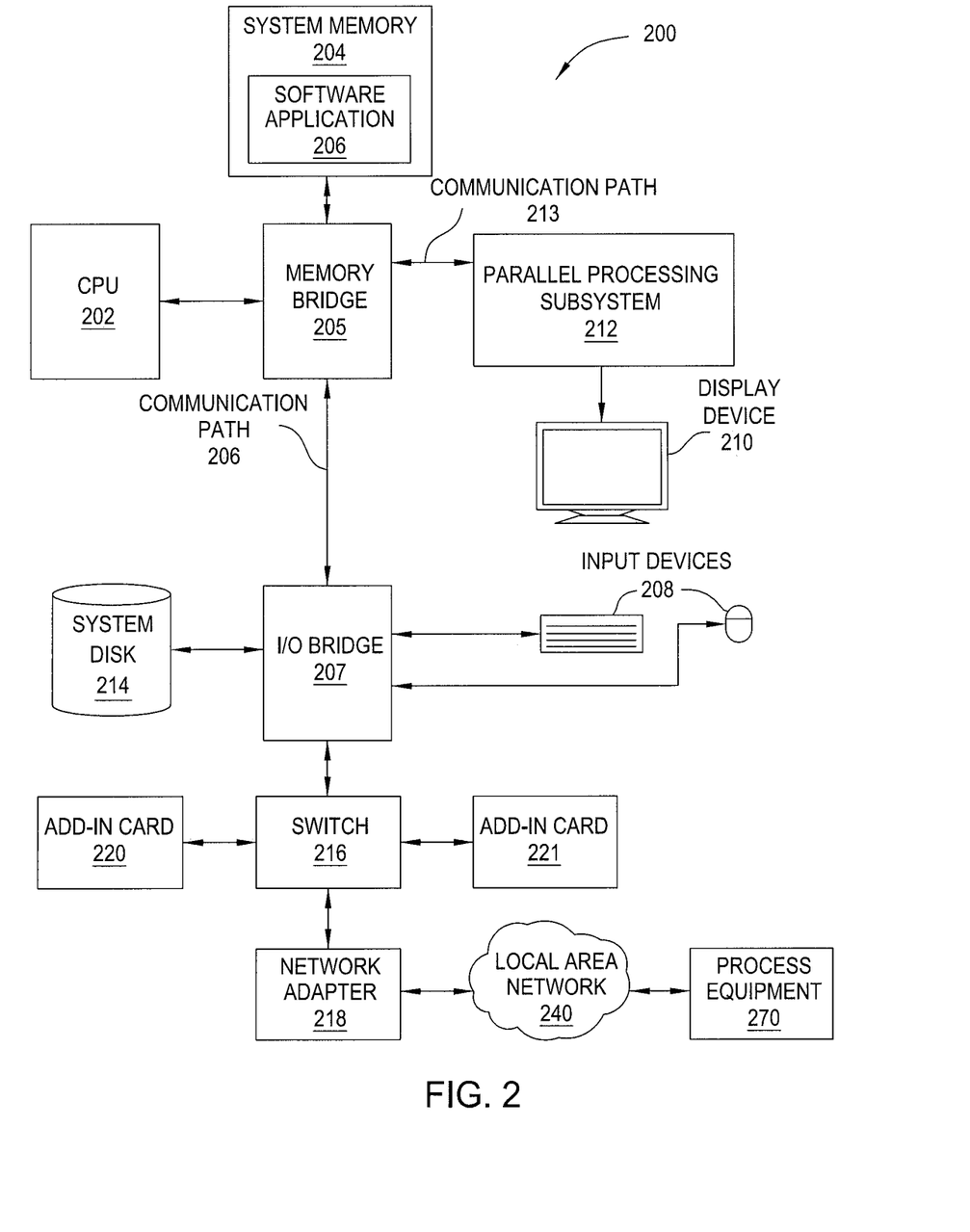
FIG. 2 depicts one architecture of a system suitable for storing and executing software routines in which embodiments of the present invention may be implemented.

FIG. 2 depicts one architecture of a system suitable for storing and executing software routines in which embodiments of the present invention may be implemented. This figure in no way limits or is intended to limit the scope of the present invention. The system 200 may be a personal computer, industrial processor, personal digital assistant, mobile phone, mobile device or any other device suitable for practicing one or more embodiments of the present invention. The system 200 may describe in whole or in part, the controller 182 or computing device attached thereto.

The system 200 includes a central processing unit (CPU) 202 and a system memory 204 communicating via a bus path that may include a memory bridge 205. CPU 202 includes one or more processing cores, and, in operation, CPU 202 is the master processor of the system 200, controlling and coordinating operations of other system components. System memory 204 stores a software application 206, and data, for use by CPU 202. CPU 202 runs software applications and optionally an operating system. Memory bridge 205, which may be, e.g., a Northbridge chip, is connected via a bus or other communication path (e.g., a HyperTransport link) to an I/O (input/output) bridge 207. I/O bridge 207, which may be, e.g., a Southbridge chip, receives user input from one or more user input devices 208 (e.g., keyboard, mouse, joystick, digitizer tablets, touch pads, touch screens, still or video cameras, motion sensors, and/or microphones) and forwards the input to CPU 202 via memory bridge 205.

A display processor 212 is coupled to the memory bridge 205 via a bus or other communication path (e.g., a PCI Express, Accelerated Graphics Port, or HyperTransport link); in one embodiment display processor 212 is a graphics subsystem that includes at least one graphics processing unit (GPU) and graphics memory. Graphics memory includes a display memory (e.g., a frame buffer) used for storing pixel data for each pixel of an output image. Graphics memory can be integrated in the same device as the GPU, connected as a separate device with the GPU, and/or implemented within system memory 204.

Display processor 212 periodically delivers pixels to a display device 210 (e.g., a screen or conventional CRT, plasma, OLED, SED or LCD based monitor or television). Additionally, display processor 212 may output pixels to film recorders adapted to reproduce computer generated images on photographic film. Display processor 212 can provide display device 210 with an analog or digital signal.

A system disk 214 is also connected to I/O bridge 207 and may be configured to store content and applications and data, such as a database library 215, for use by CPU 202 and display processor 212. System disk 214 provides non-volatile storage for applications and data and may include fixed or removable hard disk drives, flash memory devices, and CD-ROM, DVD-ROM, Blu-ray, HD-DVD, or other magnetic, optical, or solid state storage devices.

A switch 216 provides connections between the I/O bridge 207 and other components such as a network adapter 218 and various add-in cards 220 and 221. Network adapter 218 allows the system 200 to communicate with other systems via an electronic communications network, and may include wired or wireless communication over local area networks 240 and wide area networks such as the Internet.

Other components (not shown), including USB or other port connections, film recording devices, and the like, may also be connected to I/O bridge 207. For example, process equipment 270 may operate from instructions and/or data provided by CPU 202, system memory 204, or system disk 214. Communication paths interconnecting the various components in FIG. 2 may be implemented using any suitable protocols, such as PCI (Peripheral Component Interconnect), PCI Express (PCI-E), AGP (Accelerated Graphics Port), HyperTransport, or any other bus or point-to-point communication protocol(s), and connections between different devices may use different protocols, as is known in the art.

The process equipment 270 may be one or more semiconductor chambers such as a plasma enhanced chemical vapor deposition (PECVD) or other plasma processing tool. For example, process equipment 270 may be an etch chamber, a chemical vapor deposition chamber, a physical vapor deposition chamber, an implant chamber, a plasma treatment chamber, or other plasma processing chamber, either alone or in combination with one or more other chambers, such as processing chamber 100.

In one embodiment, display processor 212 incorporates circuitry optimized for performing mathematical operations, including, for example, math co-processor, and may additionally constitute a graphics processing unit (GPU). In another embodiment, display processor 212 incorporates circuitry optimized for general purpose processing. In yet another embodiment, display processor 212 may be integrated with one or more other system elements, such as the memory bridge 205, CPU 202, and I/O bridge 207 to form a system on chip (SoC). In still further embodiments, display processor 212 is omitted and software executed by CPU 202 performs the functions of display processor 212.

Pixel data can be provided to display processor 212 directly from CPU 202. In some embodiments of the present invention, instructions and/or data representing a predictive analysis is provided to set of server computers, each similar to the system 200, via network adapter 218 or system disk 214. The servers may perform operations on subsets of the data using the provided instructions for analysis. The results from these operations may be stored on computer-readable media in a digital format and optionally returned to the system 200 for further analysis or display. Similarly, data may be output to other systems for display, stored in a database library 215 on the system disk 214, or stored on computer-readable media in a digital format.

Alternatively, CPU 202 provides display processor 212 with data and/or instructions defining the desired output images, from which display processor 212 generates the pixel data of one or more output images, including characterizing and/or adjusting the offset between stereo image pairs. The data and/or instructions defining the desired output images can be stored in system memory 204 or graphics memory within display processor 212. CPU 202 and/or display processor 212 can employ any mathematical, function or technique known in the art to create one or more results from the provided data and instructions, including running models and comparing data from sensors to track the service life of chamber components.

It will be appreciated that the system shown herein is illustrative and that variations and modifications are possible. The connection topology, including the number and arrangement of bridges, may be modified as desired. For instance, in some embodiments, system memory 204 is connected to CPU 202 directly rather than through a bridge, and other devices communicate with system memory 204 via memory bridge 205 and CPU 202. In other alternative topologies display processor 212 is connected to I/O bridge 207 or directly to CPU 202, rather than to memory bridge 205. In still other embodiments, I/O bridge 207 and memory bridge 205 might be integrated into a single chip. The particular components shown herein are optional; for instance, any number of add-in cards or peripheral devices might be supported. In some embodiments, the process equipment 270 may be connected directly to the I/O bridge 207. In some embodiments, the switch 216 is eliminated, and the network adapter 218 and the add-in cards 220, 221 connect directly to the I/O bridge 207.

Various embodiments of the invention may be Implemented as a program product for use with a computer system. The software routines of the program product define functions of the embodiments (including the methods described herein) and can be contained on a variety of computer-readable storage media. Illustrative computer-readable storage media include, but are not limited to: (i) non-writable storage media (e.g., read-only memory devices within a computer such as CD-ROM disks readable by a CD-ROM drive, flash memory, ROM chips or any type of solid-state non-volatile semiconductor memory) on which information is permanently stored; and (ii) writable storage media (e.g., floppy disks within a diskette drive or hard-disk drive or any type of solid-state random-access semiconductor memory) on which alterable information is stored.

Any combination of one or more computer readable medium(s) may be utilized for storing a program product which, when executed, is configured to perform method for determining the service life of a chamber component such as the susceptor 107. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, radio, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as JAVA™, SMALLTALK™, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The computer program instructions may also be loaded onto a computer, other programmable data processing apparatus, or other devices to cause a series of operations to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Embodiments of the invention may be provided to end users through a cloud computing infrastructure. Cloud computing refers to the provision of scalable computing resources as a service over a network. More formally, cloud computing may be defined as a computing capability that provides an abstraction between the computing resource and its underlying technical architecture (e.g., servers, storage, networks), enabling convenient, on-demand network access to a shared pool of configurable computing resources that can be rapidly provisioned and released with minimal management effort or service provider interaction. Thus, cloud computing allows a user to access virtual computing resources (e.g., storage, data, applications, and even complete virtualized computing systems) in "the cloud," without regard for the underlying physical systems (or locations of those systems) used to provide the computing resources.

Typically, cloud computing resources are provided to a user on a pay-per-use basis, where users are charged only for the computing resources actually used (e.g., an amount of storage space consumed by a user or a number of virtualized systems instantiated by the user). A user can access any of the resources that reside in the cloud at any time, and from anywhere across the Internet. In context of the present invention, a user may access software routines (e.g., a method for detecting the breakage of one or more of the grounding straps) or related data available in the cloud. For example, the software routines could execute on a computing system in the cloud. In such a case, the software routines could maintain spatial and non-spatial data at a storage location in the cloud. Doing so allows a user to access this information from any computing system attached to a network connected to the cloud (e.g., the Internet).

Figure 3:
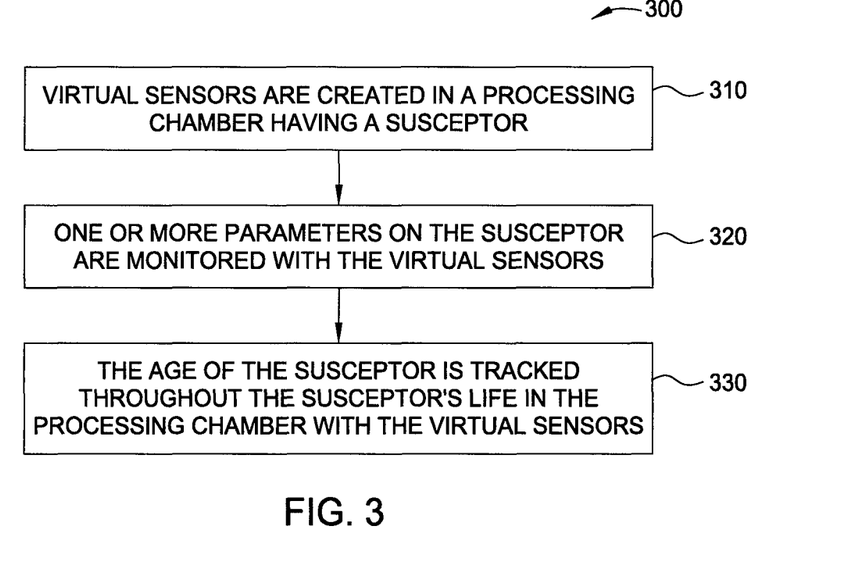
FIG. 3 illustrates a method for tracking the age of a susceptor throughout its life in the processing chamber.

FIG. 3 illustrates a method 300 for tracking the age of a susceptor throughout its life in the processing chamber. The method begins at block 310, where virtual sensors are created in the processing chamber having the susceptor. The virtual sensors may not physically existing as such but made by software to appear to do so using the capabilities from a plurality of sensors existing in the chamber for measuring emissivity and temperature among other chamber conditions. For example, the virtual sensors may use the sensing capabilities of the pyrometers 118, power indicators, thermal radiation sensors, or other available sensors 140 for collecting chamber environmental data. Software may carry out operations which use the existing sensors for modeling the service life of the chamber component. The virtual sensor may then track the susceptor age throughout its life in the chamber based on assumptions where the emissivity changes as susceptor's age and the susceptor is in steady state thermal equilibrium, such as during the execution of a chamber recipe for cleaning.

At block 320, one or more parameters on the susceptor are monitored with the virtual sensors. The substrate may be removed from the processing chamber during monitoring. A recipe, such as a cleaning or simple steady state recipe for maintaining the environmental conditions within the chamber may be run during the collection of data while monitoring. For example, emissivity and temperature may be monitored at the susceptor with an appropriate sensor.

The difference in susceptor emissivity (between new and old susceptor) can be identified through careful selection of the data collection time window during the recipe. Experiments have identified the susceptor emissivity difference between a new susceptor and an old susceptor. The virtual sensor and the recipe provide input for a function to determine a threshold value for one or more parameters to be utilized along with a predictive model for the age of the susceptor. The changes beyond a predefined threshold value leads to defects and variance in tolerance for substrates processed on the susceptor.

At block 330, the age of the susceptor is tracked throughout the susceptor's service life in the processing chamber with the virtual sensors. The method may include detecting a susceptor's temperature and a susceptor's emissivity at an edge of the susceptor with the virtual sensor. The remaining service life for the susceptor may then be calculated.

Emissivity changes as susceptor's age due to topography changes as the susceptor is etched. For example, over time angular features are "smoothened" out or "blurred" out; erosion creates non-flat/wavy surfaces. Pitting occurs at the grain boundaries; and the surface area of susceptor increases. An indicator (i.e., virtual sensor) of this overall chamber emissivity difference (between new and used susceptor) can be identified with a sensor to detect the emissivity and/or temperature which is then compared with a model to determine the age of the susceptor.

An index of this overall susceptor emissivity or temperature difference can be successfully identified through careful selection of the recipe and window for sensing an edge of the susceptor. The difference can be compared to a model to determine the service life and predict how much longer the susceptor may have prior to needing to be replaced. Upon the emissivity or temperature of the susceptor reaching a threshold, processing chamber downtime may be scheduled to perform maintenance and replace the susceptor.

Figure 4:
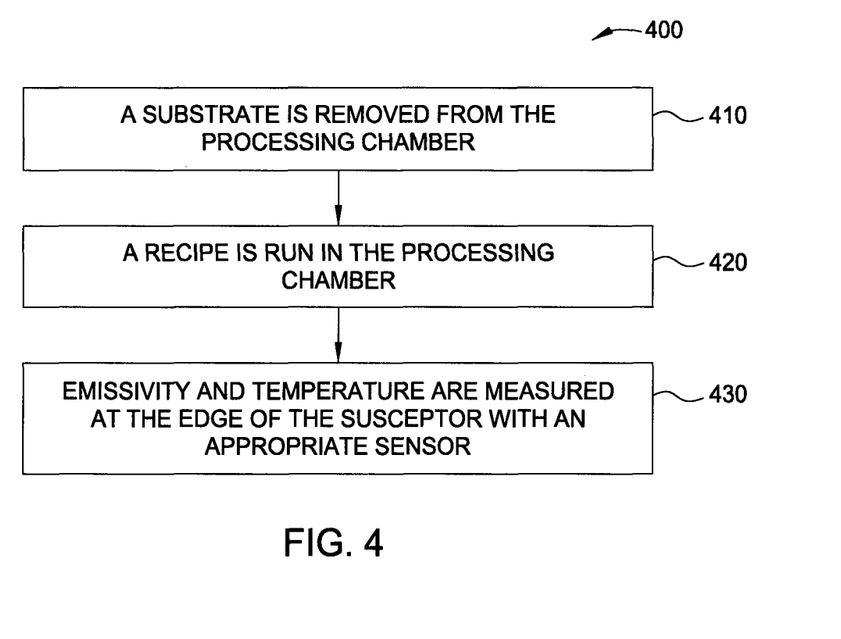
FIG. 4 illustrates one example implementation for determining the susceptor age.

FIG. 4 illustrates one example implementation for determining the susceptor age. The method begins at block 410, wherein a substrate is removed from the processing chamber. At block 420, a recipe is run in the processing chamber. The controller may utilize one recipe or a particular step to ensure chamber conditions are substantially similar when performing any measurement or sensing of the chamber environment.

In one example, the recipe used when sensing the susceptor may utilize a power between about 20 KW and about 40 KW, during calibrating and sampling data by the sensors. The power may have a recipe which sets the wattage for several samples of temperature or emissivity to be taken. For example, one sample of the data may be taken when the power is between about 20 KW and about 25 KW, while a second sample of the data is taken with the power set to about 30 KW, and a third sample of the data is taken with the power set to about 40 KW.

In another example, the recipe used when sensing the susceptor may utilize a temperature between about 600° Celsius and about 800° Celsius, during calibrating and sampling data by the sensors. The temperature may have a recipe which sets the lamps on to heat the chamber for several samples of temperature or emissivity to be taken. For example, one sample of the data may be taken when the temperature is between about 680° Celsius, while a second sample of the data is taken with the temperature is set to about 740° Celsius.

At block 430, the emissivity and temperature are measured at the edge of the susceptor with an appropriate sensor. The temperature and emissivity may be measured several times corresponding to the recipe intervals as discussed above. The process equipment may be brought off-line to replace the susceptor upon one or more parameters measured exceeding the threshold value indicating an end of life for the susceptor.

The downtime for preventative maintenance may take 3 or more days and susceptors are expensive. Advantageously, the method described above reduces downtime by ensuring preventative maintenance is only performed when it is needed. Furthermore, the number of lifecycles (processes substrates) for the susceptor may be extended. In one embodiment, the lifecycle was extended from 3000 cycles to near 5000 cycles.

While the foregoing is directed to embodiments of the present invention, other and further embodiments of the invention may be devised without departing from the basic scope thereof, and the scope thereof is determined by the claims that follow.

What is claimed is:

1. A method for determining a service life of a susceptor disposed in a processing chamber, the method comprising:
    monitoring one or more parameters of the susceptor disposed in a processing chamber with virtual sensors, the one or more parameters corresponding to the sensing capabilities of one or more physical sensors, the virtual sensors using the sensing capabilities of the one or more physical sensors; and
    tracking an age of the susceptor due to topography changes throughout the service life of the susceptor in the processing chamber with the parameters monitored by the virtual sensors.

2. The method of claim 1, wherein the susceptor is in steady state thermally.

3. The method of claim 2, wherein monitoring one or more parameters of the susceptor further comprises:
    monitoring an emissivity of the susceptor.

4. The method of claim 3 further comprising:
    running a recipe in the chamber to determine a change in the emissivity of the susceptor over time.

5. The method of claim 1 further comprising;
    determining a threshold value for the one or more parameters with a predictive model; and
    bringing the processing chamber off line to replace the susceptor in response to the one or more parameters exceeding the threshold value.

6. The method of claim 1 further comprising:
    providing a temperature and emissivity at an edge of the susceptor to the virtual sensors; and
    calculating a remaining service life of the susceptor.

7. The method of claim 1, wherein monitoring the one or more parameters comprises:
    removing a substrate from the processing chamber;
    running a recipe; and
    measuring emissivity and temperature at the edge of the susceptor with an appropriate sensor.

8. The method of claim 1, wherein the one or more physical sensors corresponding to the one or more parameters include one or more of pyrometers, power indicators, thermal radiation sensors, or other sensors for collecting chamber environmental data.

9. A non-transitory computer readable storage medium comprising a program product which, when executed, is configured to perform an operation for predicting a susceptor service life in a processing chamber, the operation comprising:
    monitoring one or more parameters of the susceptor disposed in a processing chamber with virtual sensors, the one or more parameters corresponding to the sensing capabilities of one or more physical sensors, the virtual sensors using the sensing capabilities of the one or more physical sensors; and
    tracking an age of the susceptor throughout the service life of the susceptor in the processing chamber with the parameters monitored by the virtual sensors.

10. The non-transitory computer readable storage medium of claim 9, wherein the susceptor is in steady state thermally.

11. The non-transitory computer readable storage medium of claim 10, wherein monitoring one or more parameters further comprises:
    emissivity of the susceptor is one of the parameters monitored.

12. The non-transitory computer readable storage medium of claim 11, further comprising:
    running a recipe in the chamber to determine a change in the emissivity of the susceptor over time.

13. The non-transitory computer readable storage medium of claim 9, further comprising;
    determining a threshold value for one or more parameters with a predictive model; and
    replacing the susceptor in response to the one or more parameters measured exceeding the threshold value.

14. The non-transitory computer readable storage medium of claim 9, further comprising:
    providing a temperature and emissivity at an edge of the susceptor to the virtual sensors; and
    calculating a remaining service life of the susceptor.

15. The non-transitory computer readable storage medium of claim 9, monitoring one or more parameters comprises:
    removing a substrate from the processing chamber;
    running a recipe; and
    measuring emissivity and temperature at the edge of the susceptor with an appropriate sensor.

16. A system comprising:
a processor; and
a memory, wherein the memory includes an application program configured to perform an operation for predicting a service life of a susceptor disposed in a processing chamber, the operation comprising:
    monitoring one or more parameters of the susceptor disposed in a processing chamber with virtual sensors, the one or more parameters corresponding to the sensing capabilities of one or more physical sensors, the virtual sensors using the sensing capabilities of the one or more physical sensors; and
    tracking an age of the susceptor throughout the service life of the susceptor in the processing chamber with the parameters monitored by the virtual sensors.

17. The system of claim 16, wherein emissivity of the susceptor is one of the parameters monitored.

18. The system of claim 17, further comprising:
running a recipe in the chamber to determine a change in the susceptor emissivity over time.

19. The system of claim 16, further comprising;
determining a threshold value for one or more parameters with a predictive model; and
bringing the processing chamber off line to replace the susceptor upon the one or more parameters measured exceeding the threshold value.

20. The system of claim 16, further comprising: providing a temperature and emissivity at an edge of the susceptor to the virtual sensors; and calculating the remaining service life for the susceptor.

21. The system of claim 16, monitoring one or more parameters comprises:
removing a substrate from the processing chamber;
running a recipe; and
measuring emissivity and temperature at the edge of the susceptor with an appropriate sensor.

* * * * *